United States Patent
Adachi et al.

(10) Patent No.: US 6,461,962 B1
(45) Date of Patent: Oct. 8, 2002

(54) ETCHING METHOD

(75) Inventors: Kenji Adachi, Yamanashi; Michiaki Sano, Chiba, both of (JP)

(73) Assignee: Tokyo Electron Limited, Tokyo (JP)

( * ) Notice: Subject to any disclaimer, the term of this patent is extended or adjusted under 35 U.S.C. 154(b) by 25 days.

(21) Appl. No.: 09/650,647

(22) Filed: Aug. 30, 2000

(30) Foreign Application Priority Data

Sep. 1, 1999 (JP) ............................................ 11-247485

(51) Int. Cl.$^7$ ............................................. H01L 21/302
(52) U.S. Cl. ...................... 438/689; 438/714; 438/715; 438/723; 438/724; 216/22; 216/27
(58) Field of Search .................................. 438/689, 714, 438/715, 723, 724, 740; 216/22, 27, 66, 67

(56) References Cited

U.S. PATENT DOCUMENTS 6,015,760 A * 1/2000 Becker et al. ............... 438/714
6,254,966 B1 * 7/2001 Kondo ........................ 428/156

* cited by examiner

Primary Examiner—David Nelms
Assistant Examiner—Reneé R. Berry
(74) Attorney, Agent, or Firm—Finnegan, Henderson, Farabow, Garrett & Dunner, LLP

(57) ABSTRACT

An etching method through which the resist-relative selection ratio is improved and the etching shape is also improved, is provided.

In an etching method for etching an $SiO_2$ layer formed at a wafer W placed inside an airtight processing chamber 104 by inducing a processing gas into the processing chamber 104, the processing gas contains at least $C_5F_8$ and $CH_2F_2$ and the flow rate ratio of $C_5F_8$ and $CH_2F_2$ in the processing gas is essentially within the range of $1/4 \leq (C_5F_8$ flow rate/$CH_2F_2$ flow rate$) \leq 1/2$. Since the processing gas contains $C_5F_8$ and $CH_2F_2$, the resist-relative selection ratio can be improved. In addition, by setting the flow rate ratio of $C_5F_8$ and $CH_2F_2$ essentially equal to or larger than 1/4, deformation of grooves due to longitudinal streaking or waviness can be eliminated, whereas by setting the flow rate ratio of $C_5F_8$ and $CH_2F_2$ essentially equal to or smaller than 1/2, deformation of grooves attributable to bowing can be eliminated.

6 Claims, 3 Drawing Sheets

(c1) Center (c2) Middle (c3) Edge

ETCHING METHOD

BACKGROUND OF THE INVENTION

The present invention relates to an etching method.

A gas containing a high concentration of fluorine atoms such as $CHF_3$, $CH_2F_2$, $CF_4$ or $C_4F_8$ is normally used as an etching gas in a dry etching process for forming grooves such as contact holes, in order to create a reaction seed containing fluorine through plasma discharge or the like. The etching process is implemented by using a processing gas achieved by mixing Ar which is mainly used for gas flow rate ratio control or $O_2$ which is mainly used to improve penetration, i.e., to promote etching along the depthwise direction in such a fluorine-containing gas. Typical examples of processing gas combinations in the prior art include $CHF_3+Ar+O_2$, $CH_2F_2+CF_4+Ar$, $C_4F_8+CH_2F_2+Ar+O_2$.

PRIOR ART $CH_2F_2$ is one of the gases most frequently used among the fluorine-containing gases mentioned above utilized in etching processes. The frequent use of $CH_2F_2$ is attributable to its high resist-relative selection ratio. It is to be noted that the term "resist-relative selection ratio" used in this specification refers to the value expressed as (average etching rate of the etching target film)/(etching rate of photoresist). Openings of grooves formed by using a processing gas with a low resist-relative selection ratio tend to be large and are not, therefore, desirable.

However, while the resist-relative selection ratio may be improved by raising the flow rate ratio of $CH_2F_2$ in the processing gas, there is a problem in that the shapes of grooves formed using such a processing gas become abnormal. This problem is assumed to be caused by H and HF that are generated when $CH_2F_2$ becomes dissociated during the plasma process and subsequently isotropically etch the areas around the holes. Accordingly, the flow rate ratio of $CH_2F_2$ is adjusted by using a processing gas having $C_4F_8$, Ar and $O_2$ mixed with $CH_2F_2$ as described above in the prior art.

When $C_4F_8$ is used to control the flow rate ratio of $CH_2F_2$, the following problems occur. Firstly, while the shape of grooves that are formed is improved to a certain extent, deformation such as bowing, longitudinal streaking and waviness still occur and thus, a full improvement in correcting deformation is not realized. Secondly, the degree to which the resist-relative selection ratio becomes lowered far exceeds the extent to which the shape of the grooves is improved. In reality, the resist-relative selection ratio is lowered to approximately 3.0~4.0 and the openings of the grooves become wide.

SUMMARY OF THE INVENTION

A first object of the present invention, which has been completed by addressing the problems of the etching method in the prior art, is to provide a new and improved etching method through which the resist-relative selection ratio can be improved.

A second object of the present invention is to provide a new and improved etching method through which the etching shape can be improved.

In order to achieve the objects described above, the etching method according to the present invention, which is implemented on an $SiO_2$ layer formed on a workpiece placed inside an airtight processing chamber by inducing a processing gas into the processing chamber is characterized in that the processing gas contains at least $C_5F_8$ and $CH_2F_2$ and in that the flow rate ratio of $C_5F_8$ and $CH_2F_2$ in the processing gas is essentially within a range of $1/4 \leq (C_5F_8 \text{ flow rate}/CH_2F_2 \text{ flow rate}) \leq 1/2$.

The processing gas may also contain $O_2$.

In this case, it is most desirable to ensure that the flow rates of $C_5F_8$ $CH_2F_2$ and $O_2$ in the processing gas essentially achieve a relationship expressed as $((C_5F_8 \text{ flow rate}+CH_2F_2 \text{ flow rate})/O_2 \text{ flow rate})=1.5/1$, with the allowable range being $0.5/1 \leq ((C5F8 \text{ flow rate}+CH_2F_2 \text{ flow rate})/O_2 \text{ flow rate}) \leq 3/1$.

The processing gas may also contain Ar.

In addition, etching may be performed under a condition expressed as ($SiO_2$ layer average etching rate/photoresist etching rate)$\geq 10$, i.e. under the condition in which the resist-relative selection ratio is 10 or larger.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of preferred embodiments of the etching method according to the present invention, given in reference to the attached drawings. It is to be noted that in this specification and the drawings, the same reference numbers are assigned to components achieving essentially identical functions and structural features to preclude the necessity for repeated explanation thereof.

(1) Structure of Etching Apparatus

Figure 1:
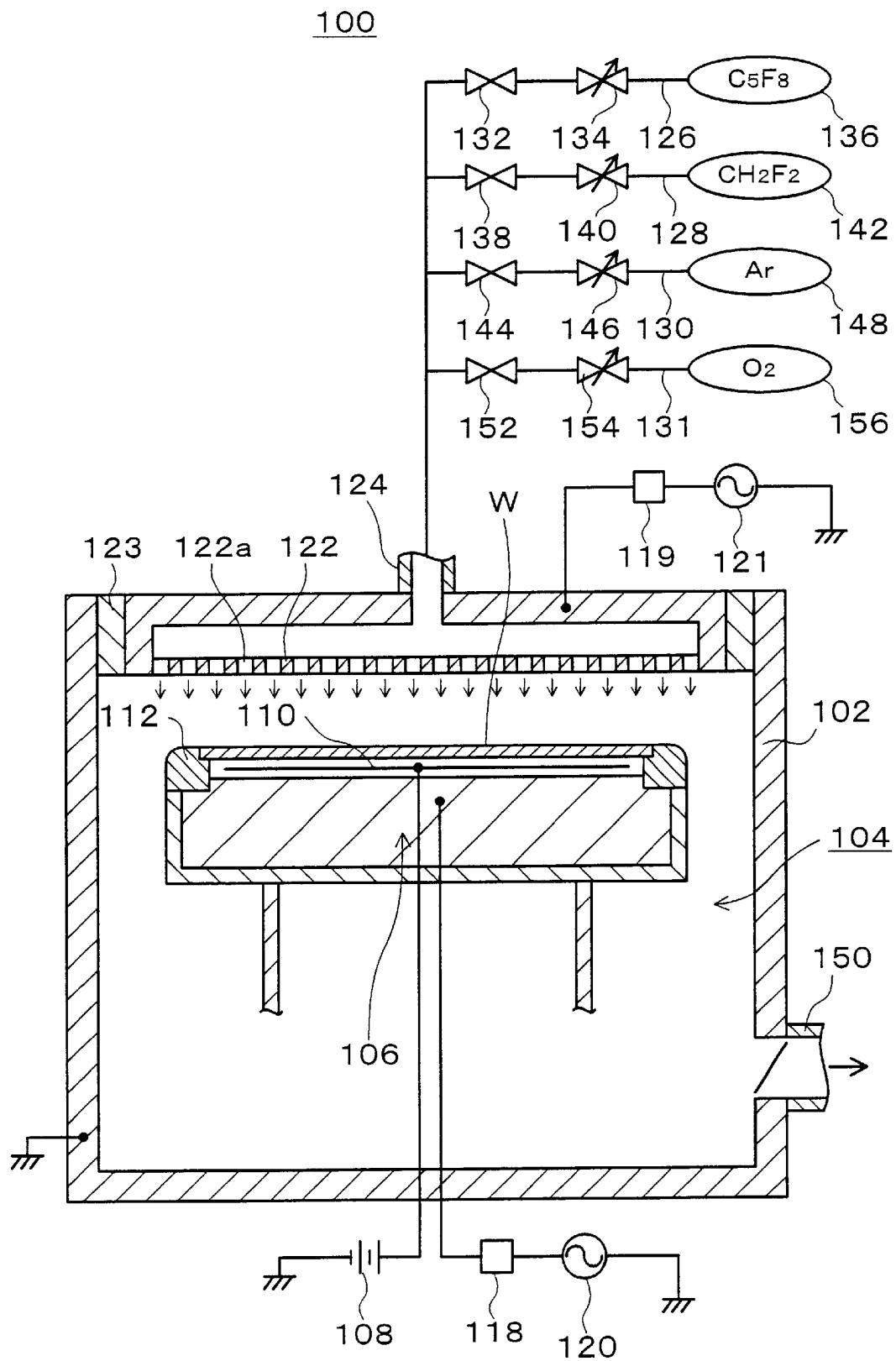
FIG. 1 is a schematic sectional view of an etching apparatus that may adopt the present invention.

First, in reference to FIG. 1, an etching apparatus 100 that may adopt the etching method in the embodiment is explained.

Inside a processing container 102 of the etching apparatus 100 in the figure, a processing chamber 104 is formed, and inside the processing chamber 104, a lower electrode 106 constituting a susceptor capable of moving up and down freely is provided. At the top of the lower electrode 106, an electrostatic chuck 110 connected to a high-voltage DC source 108 is provided, and a workpiece such as a semiconductor wafer (hereafter referred to as a "wafer") W is placed on the upper surface of the electrostatic chuck 110. In addition, a focus ring 112 achieving an insulating property is provided around the wafer W placed on the lower electrode 106. A high-frequency source 120 is connected to the lower electrode 106 via a matcher 118.

At the ceiling of the processing chamber 104 facing opposite the mounting surface of the lower electrode 106, an upper electrode 122 having numerous gas outlet holes 122a is provided. An insulator 123 is provided between the upper electrode 122 and the processing container 102. A high-frequency source 121 that outputs plasma generating high-frequency power is connected to the upper electrode 122 via a matcher 119. A gas supply pipe 124 is connected to the gas outlet holes 122a, and in the example shown in the figure, first~fourth branch pipes 126, 128, 130 and 131 are connected to the gas supply pipe 124.

A gas supply source 136 that supplies $C_5F_8$ is connected to the first branch pipe 126 via an open/close valve 132 and a flow-rate regulating valve 134. A gas supply source 142 that supplies $CH_2F_2$ is connected to the second branch pipe 128 via an open/close valve 138 and a flow-rate regulating valve 140. A gas supply source 148 that supplies Ar is connected to the third branch pipe 130 via an open/close valve 144 and a flow-rate regulating valve 146. A gas supply source 156 that supplies $O_2$ is connected to the fourth branch pipe 131 via an open/close valve 152 and a flow-rate regulating valve 154. The inert gas added into the processing gas is not limited to Ar in the example above and any inert gas including He and Kr may be used instead, as long as it can be utilized to adjust the plasma excited inside the processing chamber 104.

In addition, near the bottom of the processing container 102, a gas discharge pipe 150 which communicates with a vacuum drawing mechanism (not shown) is connected, and through the function of the vacuum drawing mechanism, the atmosphere inside the processing chamber 104 is sustained at a specific reduced pressure.

(2) Structure of Wafer

Next, the structure of the wafer W to undergo the etching process through the etching method in the embodiment is explained.

The wafer W used in the embodiment has a silicon oxide film, e.g., an $SiO_2$ film constituting an insulating film to undergo the etching process formed on an Si (silicon) substrate. It is to be noted that instead of an $SiO_2$ film, an insulating film constituted of BPSG (silicate glass constituted of boron and phosphorus), PSG (silicate glass constituted of phosphorous), TEOS (tetra-ethoxy ortho-silane), Th—OX (thermal oxide) or SOG (spion glass) may be formed.

In addition, an etching mask having a specific pattern is formed on the $SiO_2$ film. This etching mask may be constituted of a photoresist film layer, for instance.

Next, an etching process performed using the etching apparatus 100 described above to form contact holes on the wafer W through the etching method in the embodiment is explained.

First, the wafer W is placed on the lower electrode 106 the temperature of which has been preset to a specific level, and the temperature of the wafer W is sustained at approximately 31 20° C.~50° C. in conformance to particular requirements of the process. For instance, the temperature at the bottoms of the contact holes may be sustained at approximately −20° C., the temperature at the openings may be sustained at approximately 30° C. and the temperature at the sidewalls may be sustained at approximately 50° C. In addition, vacuum drawing is implemented inside the processing chamber 104 to achieve a specific pressure level for the atmosphere inside the processing chamber 104, which will correspond the requirements of the process, e.g., at approximately 10 mTorr.

Next, the processing gas in the embodiment, i.e., the processing gas achieved by mixing $C_5F_8$, $CH_2F_2$, Ar and $O_2$, is induced into the processing chamber 104 while adjusting the flow rates of the individual gases through the flow-rate regulating valves 134, 140, 146 and 154 inserted at the gas supply pipe 124. During this process, a gas flow rates are regulated so that $C_5F_8$ and $CH_2F_2$ in the processing gas achieve a flow rate ratio essentially within a range of 1/4~1/2 and, more desirably, 1/2.

In addition, the gas flow rates are regulated so that the flow rates of $C_5F_8$, $CH_2F_2$ and $O_2$ in the processing gas achieve a relationship essentially expressed as $0.5/1 \leq ((C_5F_8$ flow rate+$CH_2F_2$ flow rate)/$O_2$ flow rate)$\leq 3/1$ and, more desirably, a relationship essentially expressed as (($C_5F_8$ flow rate+$CH_2F_2$ flow rate)/$O_2$ flow rate)=1.5/1. These rates are adopted since while the penetration improves as the rate of ($C_5F_8$ flow rate+$CH_2F_2$ flow rate) relative to the $O_2$ flow rate becomes lower, bowing may occur if this rate becomes excessively low.

Accordingly, the flow rates of $C_5F_8$, $CH_2F_2$, Ar and $O_2$ in the processing gas are respectively adjusted to approximately 10 sccm, 20 sccm, 150 sccm and 20 sccm, for instance.

Next, high-frequency power with a frequency of 2 MHz and a power level of approximately 1900 W, for instance, is applied to the lower electrode 106. In addition, high-frequency power with a frequency of approximately 60 MHz and a power level of approximately 1500 W, for instance, is applied to the upper electrode 122. As a result, high density plasma is generated inside the processing container 102 and contact holes achieving a specific shape are formed at the layer insulating film of the wafer W with the plasma.

The embodiment which adopts the structure described above and utilizes the processing gas containing $C_5F_8$ and $CH_2F_2$ achieves an improvement in the resist-relative selection ratio.

In addition, if the flow rate ratio of $C_5F_8$ and $CH_2F_2$ in the processing gas is essentially equal to or larger than 1/4, deformation of contact holes due to longitudinal streaking or waviness can be eliminated, whereas if the flow rate ratio of $C_5F_8$ and $CH_2F_2$ is essentially equal to or smaller than 1/2, contact hole deformation attributable to bowing can be eliminated.

Furthermore, since the processing gas contains $O_2$, an improvement in the penetration can be achieved. Moreover, since the processing gas contains Ar, the etching conditions can be controlled with ease to facilitate control of the contact hole shape.

Figure 2:
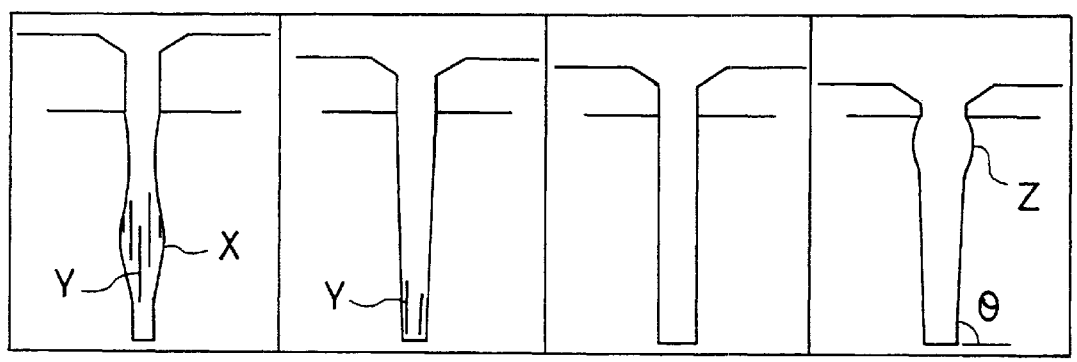
FIG. 2 schematically illustrates examples of implementation of the present invention.
Figure 3:
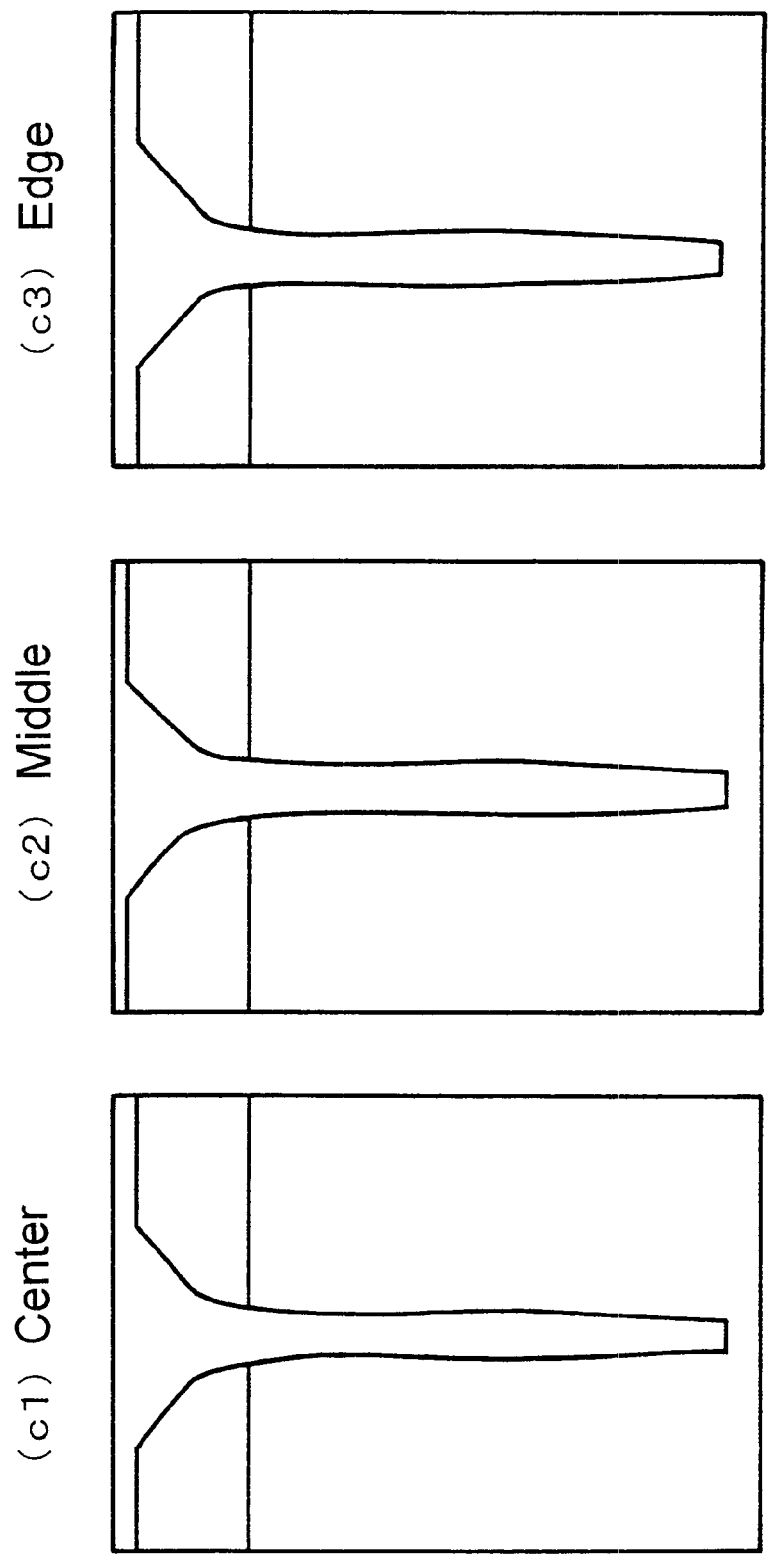
FIG. 3 schematically illustrates examples of implementation of the present invention.

Next, specific implementations of the etching method according to the present invention are explained in reference to FIGS. 2 and 3. It is to be noted that since contact holes are formed at the layer insulating film of the wafer W by using the etching apparatus 100 explained in reference to the embodiment in these examples of implementation, the same reference numbers are assigned to components of the etching apparatus 100 and the wafer W achieving roughly identical functions and structural features to preclude the necessity for repeated explanation thereof. In addition, unless specifically indicated, the etching process conditions are set virtually the same as those in the embodiment described above.

In reference to FIG. 2, examples of implementation achieved by varying the flow rate ratio of $C_5F_8$ and $CH_2F_2$ constituting the processing gas are explained.

In examples (a)~(d), the etching process was performed by adjusting the flow rate ratio of $C_5F_8$ $_{and}$ $_{CH2}F_2$ at: (a) 1:5, (b) 1:4, (c) 1:2 and (d) 1:1 to form contact holes at the layer insulating film of the wafer W described earlier. In the individual examples, the results presented in FIG. 2 and Table 1 below were achieved.

TABLE 1

| $C_5F_8:CH_2F_2$ | (a) 1:5 | (b) 1:4 | (c) 1:2 | (d) 1:4 |
|---|---|---|---|---|
| waviness (X) | present | present to a slight degree | not present | not present |
| longitudinal | present | present to a | not present | not present |

TABLE 1-continued

| $C_5F_8:CH_2F_2$ | (a) 1:5 | (b) 1:4 | (c) 1:2 | (d) 1:1 |
|---|---|---|---|---|
| streaking (Y) | | slight degree | | |
| bowing (Z) | not present | not present | not present | present |
| taper angle (θ) | 87 deg. | 88 deg. | 89 deg. | 89 deg. |
| resist-relative selection ratio | resist not etched | 100 | 10 | 4 |

(a) The results are not desirable with waviness X and longitudinal streaking Y present at $C_5F_8:CH_2F_2 = 1:5$
(b) While slight longitudinal streaking Y is present, it is not significant enough to cause a serious problem at $C_5F_8:CH_2F_2 = 1:4$. A high resist-relative selection ratio is achieved.
(c) Good results are achieved at $C_5F_8:CH_2F_2 = 1:2$, with no deformation such as bowing, longitudinal streaking and waviness observed. It is to be noted that, as shown in FIG. 3, contact holes achieving a good shape are formed uniformly over the wafer at (c1) i.e., the center of the wafer W, (c2) i.e., the middle area between the center and the edge of the wafer W and (c3) i.e., the edge of the wafer W under these conditions.
(d) The openings expand and bowing Z is observed at $C_5F_8:CH_2F_2 = 1:1$. The occurrence of bowing Z, which adversely affects semiconductor elements with increasingly fine wiring to a significant degree, should be avoided. In addition, the resist-relative selection ratio is lowered as well and, therefore, this flow rate ratio is not desirable.

Consequently, desirable examples among the flow rate ratios corresponding to the individual examples are those within the range of $C_5F_8: CH_2F_2=1:4\sim1:2$ (the flow rate ratio of $C_5F_8$ and $CH_2F_2=1/4\sim1/2$), and in this flow rate ratio range, contact holes achieving a high resist-relative selection ratio of 10 or more and a desirable shape with the taper angle close to 90°, i.e., the taper angle equal to or larger than 88°, are formed. It is to be noted that the most desirable flow rate ratio is $C_5F_8: CH_2F_2=1:2$ (flow rate ratio of $C_5F_8$ and $CH_2F_2=1/2$).

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, while an explanation is given in reference to the embodiment above on an example in which a processing gas is constituted by mixing $C_5F_8$, $CH_2F_2$, Ar and $O_2$, the present invention is not limited to this example. For instance, the present invention may be implemented by using a processing gas which does not contain Ar or $O_2$ or by adding an inert gas other than Ar in the processing gas. In other words, the present invention can be implemented using any processing gas containing at least $C_5F_8$ and $CH_2F_2$.

In addition, while an explanation is given in reference to the embodiment and the individual implementation examples on an instance in which the present invention is implemented on a plane parallel plate type etching apparatus, of the present invention is not limited to such details. It may be adopted in any of various types of plasma etching apparatuses including an etching apparatus that forms a magnetic field inside a processing chamber, an inductive coupling type etching apparatus having an electrostatic shield and a microwave etching apparatus.

Moreover, while an explanation is given above in reference to the embodiment on an example in which contact holes are formed at the layer insulating film formed at the wafer, the present invention is not limited to this example and it may be adopted when performing any type of etching process on a layer insulating film formed at a workpiece.

The entire disclosure of Japanese Patent Application No. 11-247485 filed on Sep. 1, 1999 including specification, claims, drawings and summary is incorporated herein by reference in its entirety.

What is claimed is:

1. An etching method for etching an $SiO_2$ layer formed at a workpiece placed inside an airtight processing chamber by inducing a processing gas into said processing chamber, wherein:

said processing gas contains at least $C_5F_8$ and $CH_2F_2$ and the flow rate ratio of $C_5F_8$ and $CH_2F_2$ in said processing gas is essentially within a range of $1/4 \leq (C_5F_8$ flow rate/$CH_2F_2$ flow rate$) \leq 1/2$.

2. An etching method according to claim 1, wherein:
said processing gas further contains $O_2$.

3. An etching method according to claim 2, wherein:
the flow rates of $C_5F_8$, $CH_2F_2$, and $O_2$ in said processing gas essentially achieve a relationship expressed as: $((C_5F_8$ flow rate+$CH_2F_2$ flow rate)/$O_2$ flow rate$)=1.5/1$.

4. An etching method according to claim 2, wherein:
the flow rates of $C_5F_8$, $CH_2F_2$ and $O_2$ in said processing gas essentially achieve a relationship expressed as: $0.5/1 \leq ((C_5F_8$ flow rate+$CH_2F_2$ flow rate)/$O_2$ flow rate$) \leq 3/1$.

5. An etching method according to claim 2, wherein:
said processing gas further contains Ar.

6. An etching method according to claim 1, wherein:
etching is performed under a condition expressed as ($SiO_2$ layer etching rate/photoresist etching rate$) \geq 10$.

* * * * *